United States Patent
Mushini et al.

(10) Patent No.: US 9,716,123 B2
(45) Date of Patent: Jul. 25, 2017

(54) PHOTODIODE ARRAYS

(71) Applicant: Sensors Unlimited, Inc., Princeton, NJ (US)

(72) Inventors: Prabhu Mushini, Annandale, NJ (US); Wei Huang, Plainsboro, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 14/931,543

(22) Filed: Nov. 3, 2015

(65) Prior Publication Data

US 2017/0125460 A1    May 4, 2017

(51) Int. Cl.
| H01L 31/0232 | (2014.01) |
| --- | --- |
| H01L 31/102 | (2006.01) |
| H01L 27/148 | (2006.01) |
| H01L 31/00 | (2006.01) |
| H01L 27/146 | (2006.01) |

(52) U.S. Cl.
CPC ...... *H01L 27/1463* (2013.01); *H01L 27/1462* (2013.01); *H01L 27/14634* (2013.01); *H01L 27/14643* (2013.01)

(58) Field of Classification Search
CPC ............. H01L 27/1463; H01L 27/1462; H01L 27/14634; H01L 27/14643
USPC ........ 257/233, 432, 440, 466, E33.076, 188; 438/69, 29, 70
See application file for complete search history.

(56) References Cited

U.S. PATENT DOCUMENTS

| 6,821,810 | B1 * | 11/2004 | Hsiao | H01L 27/14621 257/432 |
| --- | --- | --- | --- | --- |
| 8,089,532 | B2 | 1/2012 | Mo et al. | |
| 9,099,371 | B1 | 8/2015 | Crook | |
| 2007/0215900 | A1 * | 9/2007 | Maimon | B82Y 20/00 257/184 |
| 2008/0111152 | A1 * | 5/2008 | Scott | H01L 27/14603 257/188 |
| 2011/0031401 | A1 * | 2/2011 | Mitra | H01L 31/02966 250/338.4 |
| 2012/0001288 | A1 * | 1/2012 | Scott | H01L 27/14603 257/432 |
| 2012/0273838 | A1 * | 11/2012 | Kinch | H01L 31/02966 257/188 |
| 2013/0334645 | A1 * | 12/2013 | Wang | H01L 27/1463 257/447 |
| 2014/0175591 | A1 | 6/2014 | Tian et al. | |

* cited by examiner

*Primary Examiner* — Dzung Tran
(74) *Attorney, Agent, or Firm* — Locke Lord LLP; Scott D. Wofsy; Joshua L. Jones

(57) ABSTRACT

A photodiode includes a cap layer defining an inboard side and an outboard side. A plurality of pixels are formed in the cap layer extending from the inboard side to the outboard side. At least a portion of the cap layer is defined in between the pixels. A metal barrier is in between the pixels and is operatively connected to the inboard side of the cap layer in between the pixels to reflect light rays into the cap layer reducing the leakage of photons between the pixels.

11 Claims, 3 Drawing Sheets

PHOTODIODE ARRAYS

BACKGROUND OF THE INVENTION

1. Field of the Invention

The present disclosure relates to photodetectors, and more particularly to photodiode pixel arrays.

2. Description of Related Art

Traditional photodiode arrays are subject to leakage between pixels. Leakage between pixels generally occurs at the interface between a dielectric passivation layer and a semiconductor which tends to contribute towards the overall dark current of pixel array. Dark current is a significant contributor to the overall camera level noise and any increase in dark currently degrades the signal to noise ratio of the entire system in which the PDA's are used. The design and the method of processing the photodiode array play a significant role in defining the levels of dark current in a PDA Such conventional photodiode array designs have generally been considered satisfactory for their intended purpose. However, there is still a need in the art for improved designs.

SUMMARY OF THE INVENTION

A photodiode includes a cap layer defining an inboard side and an outboard side. A plurality of pixels are formed in the cap layer extending from the inboard side to the outboard side. At least a portion of the cap layer is defined in between the pixels. A metal barrier is in between the pixels and is operatively connected to the inboard side of the cap layer in between the pixels to reflect light rays into the cap layer reducing the leakage of photons between the pixels.

In accordance with some embodiments, photodetector includes a passivation layer on the inboard side of the cap layer, between the metal barrier and the cap layer. The metal barrier can be disposed on an inboard side of the passivation. The photodiode can include a plurality of metal overlays. Each metal overlay can be operatively connected to and extends from a respective one of the pixels through the passivation layer to the inboard side of the passivation layer. An absorption layer can be operatively connected to the outboard side of the cap layer. At least one of the pixels can extend through the cap layer into the absorption layer to receive photons therefrom. The absorption layer can be an indium gallium arsenide (InGaAs) absorption layer. The photodiode can include a substrate operatively connected to an outboard side of the absorption layer and an anti-reflective coating operatively connected to an outboard side of the substrate. The metal barrier can be at least one of a titanium, or titanium-tungsten material.

In another aspect, a photodetector includes the photodiode as described above. The photodetector can include a readout integrated circuit (ROIC) operatively connected to the photodiode. The metal barrier can be deposited between the ROIC and the cap layer. It is also contemplated that the metal barrier can be operatively connected to the ROIC via bump bonding.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
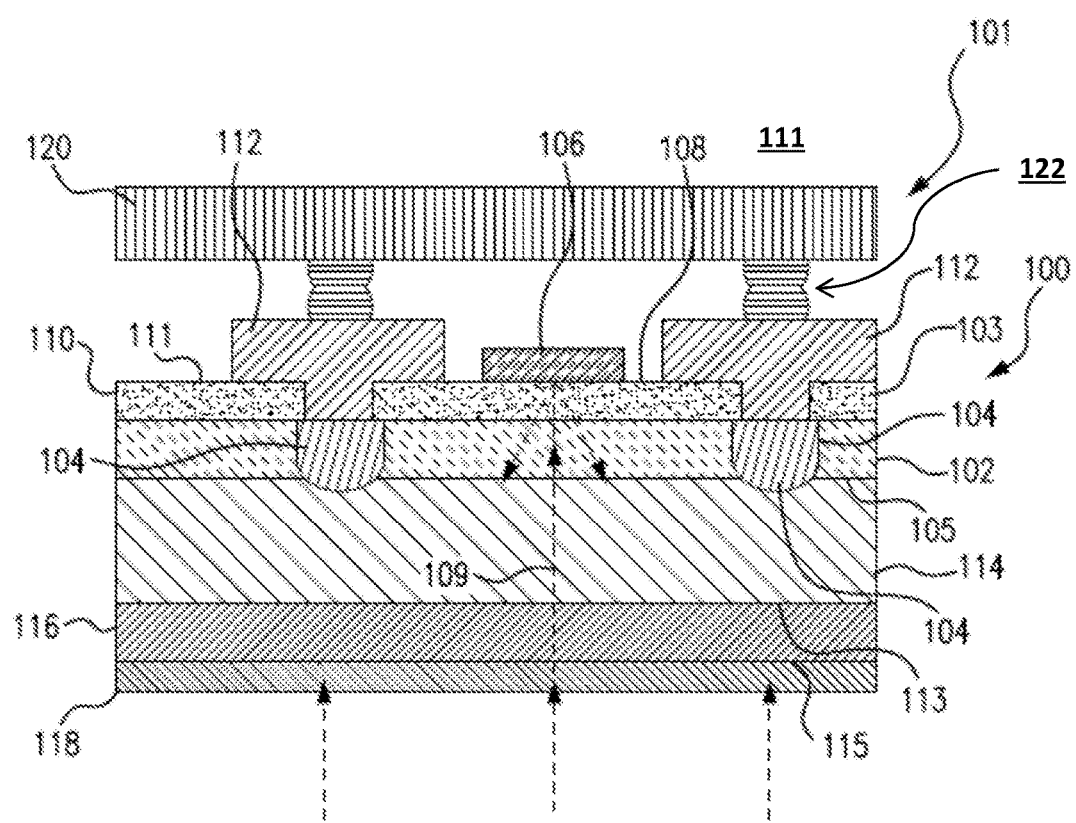
FIG. 1 is a schematic depiction of a cross-sectional view of an exemplary embodiment of a photodetector constructed in accordance with the present disclosure, showing a plurality of pixels formed in the cap layer with a portion of the cap layer and the metal barrier deposited on top of the dielectric layer between the pixels.

Reference will now be made to the drawings wherein like reference numerals identify similar structural features or aspects of the subject disclosure. For purposes of explanation and illustration, and not limitation, a partial view of an exemplary embodiment of a photodiode in accordance with the disclosure is shown in FIG. 1 and is designated generally by reference character 100. Other embodiments of photodiodes in accordance with the disclosure, or aspects thereof are provided in the following description.

As shown in FIG. 1, photodetector 101 includes a photodiode 100. Photodiode 100 includes an absorption layer 114 with specific absorption characteristics that absorbs photons from a light source (not shown) and generates electron hole pairs in that layer. Absorption layer is epitaxially grown on a highly doped substrate 116. An anti-reflective coating 118 operatively connected to an outboard side 115 of substrate 116. Absorption layer 114 can be lattice matched to substrate 116. It is also contemplated that absorption layer 114 can be strained with stress with respect to substrate 116.

With continued reference to FIG. 1, in order to prevent the exposure of absorption layer 114 to the natural elements and prevent it from oxidation or change in its semiconductor characteristics, a cap layer 102 is epitaxially grown on the top of absorption layer 114, as oriented in FIG. 1. Cap layer 102 is a semiconductor layer of the same or larger bandgap material as absorption layer 114. Cap layer 102 is lattice matched to absorption layer 114 and has a bandgap that is larger than absorption layer 114. Cap layer 102 defines an inboard side 103 and an outboard side 105. Absorption layer 114 is operatively connected to outboard side 105 of cap layer 102. It is contemplated that absorption layer 114 can be an InGaAs absorption layer 114.

Figure 2:
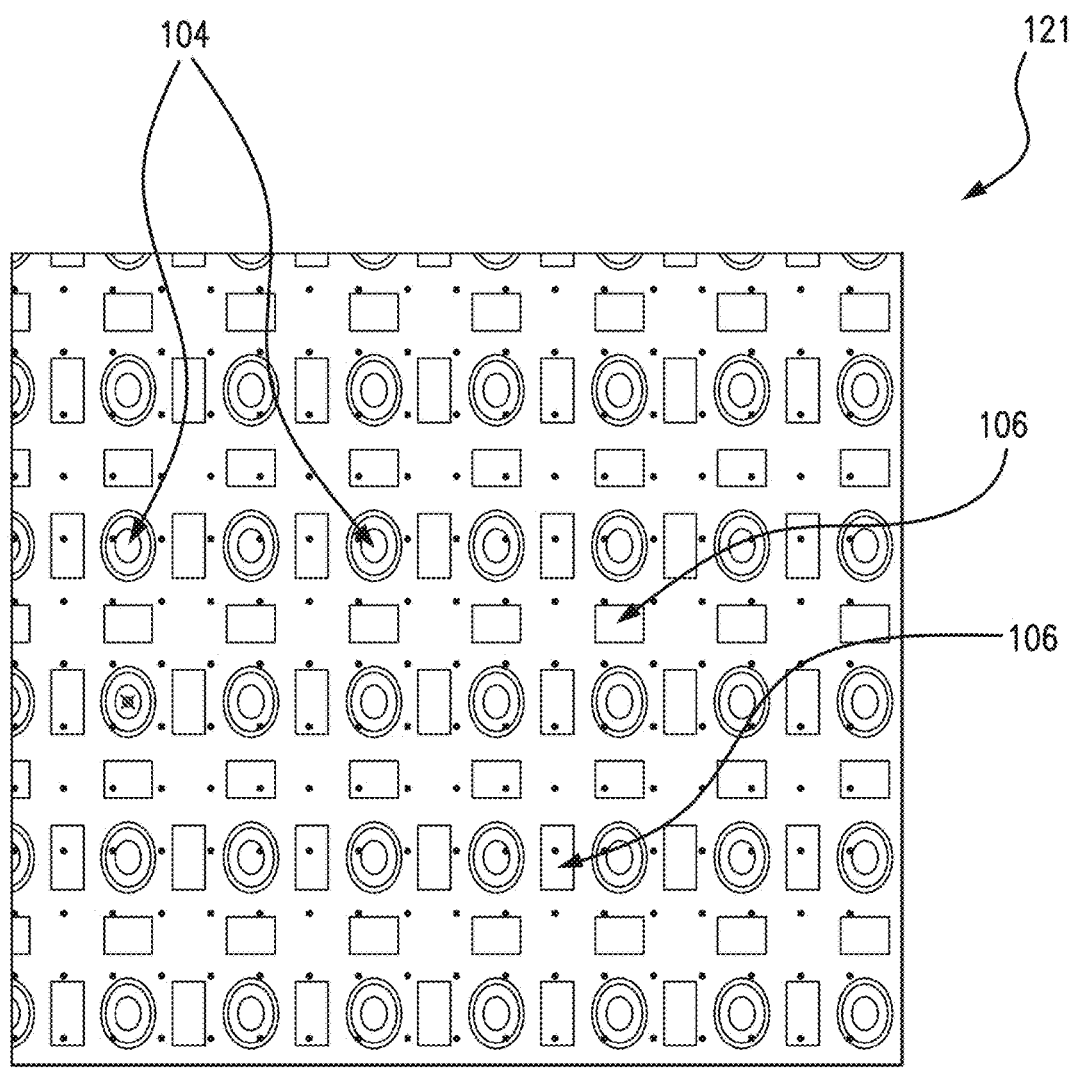
FIG. 2 is a schematic top view of an exemplary embodiment of a 2-D photodiode array constructed in accordance with the present disclosure, showing a plurality of pixels with metal barriers between the pixels.

With reference now to FIGS. 1 and 2, a plurality of pixels 104 are defined in cap layer 102 and form a photodiode array 121. Pixels 104 extend from inboard side 103 to outboard side 105 of cap layer 102. Pixels 104 extend through cap layer 102 into absorption layer 114 to receive photons therefrom. Each pixel 104 is formed by diffusing an acceptor or donor species into absorption layer 114. The area and size of each pixel 104 is defined by collection regions fabricated by diffusing, implanting and/or epitaxially growing dopants to form P+ or N+ regions on either side of absorption layer 114. At least a portion of cap layer 102 is defined in between pixels 104. In 2D array 121, pixels 104 are separated by spacing, e.g. pitch, to provide isolation between the adjacent and neighboring pixels 104 and also to provide resolution in the photo current that is collected by each individual pixel 104. Photodiode 100 includes a passivation layer 110 on inboard side 103 of the cap layer 102. Passivation layer 110 is comprised of mostly of dielectric material on cap layer 102 to provide semiconductor surface passivation and mechanical protection. The interface between dielectric passivation layer 110 and semiconductor cap layer 102 plays a role in the overall dark current of photodiode array 121.

With continued reference to FIGS. 1 and 2, a metal barrier 106 is disposed on an inboard side 111 of passivation layer 110, between passivation layer 110 and cap layer 102. Metal barrier 106 is composed of a high work function material such as, titanium, titanium-tungsten, or the like. Metal barrier 106, e.g. a schottky barrier, is in between pixels 104 and is operatively connected to inboard side of cap layer 102 through passivation layer 110 in between pixels 104 to reflect light rays or other photonic signals, schematically shown by dashed lines 109, that have already traversed through the absorption layer 114 back into cap layer 102 and absorption layer 114. This provides additional photon sources for charge generation in absorption layer 114. Additional charge generation results in higher responsivity and quantum efficiency of photodiode 100 and the overall photodiode array 121, shown in FIG. 3. Metal barrier 106 provides additional depletion into absorption layer 114 and resists photon leakage that tends to occur between pixels 104 resulting in reduced dark current.

Those skilled in the art will readily appreciate that by incorporating metal barrier 106 having a high work function on dielectric passivation layer 110 a Metal Insulator Semiconductor (MIS) structure is formed which provides an additional depletion region at the interface between dielectric passivation layer 110 and semiconductor cap layer 102. This depletion region cuts of the leakage path for charge between adjacent pixels and reduces the dark current of array 121. It is contemplated that the work function of the metal material of metal barrier 106 and the thickness of dielectric passivation layer 110 on which metal barrier 106 has been deposited can be optimized for performance under a variety of conditions.

With continued reference to FIGS. 1 and 2, photodetector 101 includes a read-out integrated circuit (ROIC) 120 operatively connected to photodiode 100 through bumps 122. Metal barrier 106 is deposited between ROIC 120 and cap layer 102. Photodiode 100 includes a plurality of metal overlays 112. Each metal overlay 112 is operatively connected to and extends from a respective one of pixels 104 through passivation layer 110 to inboard side 111 of passivation layer 110. It is contemplated that metal barrier 106 can be left floating, as shown in FIG. 1, or connected to ROIC 120 through bumps, e.g. similar to bumps 122, to be biased and used to modulate the depletion region below it at the interface of the passivation layer 110 and semiconductor cap layer 102 to reduce dark current.

Figure 3:
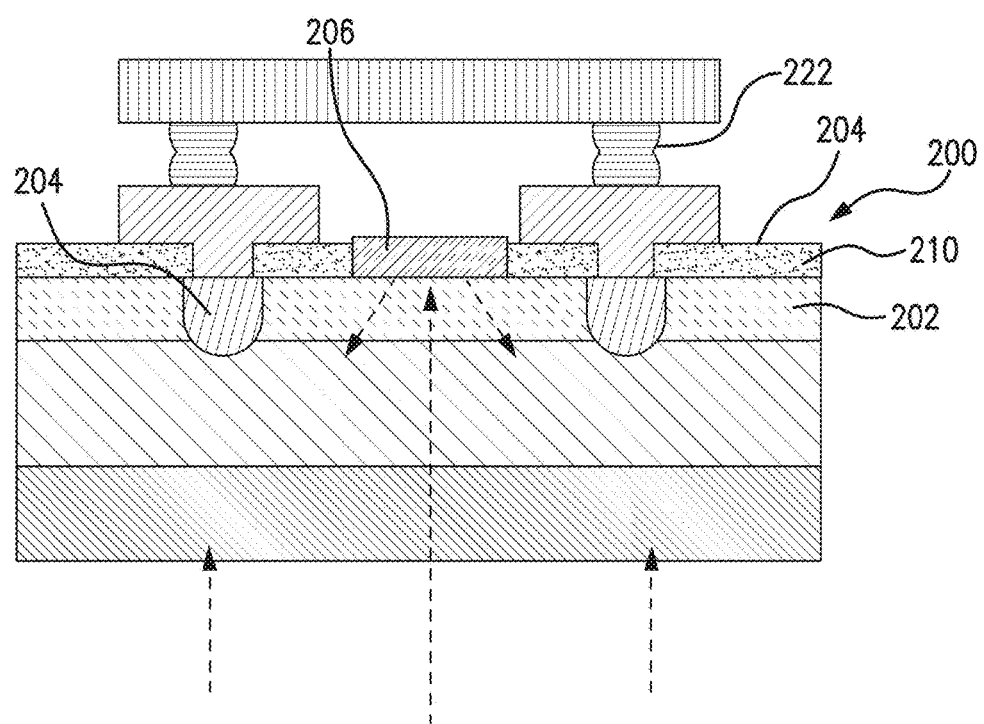
FIG. 3 is a schematic depiction of a cross-sectional view of another exemplary embodiment of a photodetector constructed in accordance with the present disclosure, showing a plurality of pixels formed in the cap layer and a metal barrier deposited within the dielectric layer in-between the pixels.

With reference to FIG. 3, another embodiment of a photodiode 200 is shown. Photodiode 200 is similar to photodiode 100 except that metal barrier 206 is defined within a passivation layer 210, similar to passivation layer 110, directly on a semiconductor cap layer 202, similar to cap layer 102, between pixels 204 thus forming a schottky junction.

The methods and systems of the present disclosure, as described above and shown in the drawings, provide for photodetectors having superior properties including reduced dark current, and higher responsivity and quantum efficiency. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A photodiode comprising:
a cap layer defining an inboard side and an outboard side;
a plurality of pixels formed in the cap layer extending from the inboard side to the outboard side of the cap layer to an absorption layer, wherein at least a portion of the cap layer is defined in between the pixels;
a metal barrier in between the pixels operatively connected to the inboard side of the cap layer in between the pixels to reflect light rays into the cap layer reducing the leakage of photons between the pixels;
a passivation layer on the inboard side of the cap layer, between the metal barrier and the cap layer, wherein the metal barrier is disposed on an inboard side of the passivation layer; and
a plurality of metal overlays, wherein each metal overlay extends through the passivation layer to the inboard side of the cap layer to operatively connect to a respective one of the pixels.

2. The photodiode as recited in claim 1, further comprising the absorption layer operatively connected to the outboard side of the cap layer, wherein at least one of the pixels extends through the cap layer into the absorption layer to receive photons therefrom.

3. The photodiode as recited in claim 2, wherein the absorption layer is an InGaAs absorption layer.

4. The photodiode as recited in claim 2, further comprising a substrate operatively connected to an outboard side of the absorption layer and an anti-reflective coating operatively connected to an outboard side of the substrate.

5. The photodiode as recited in claim 1, wherein the metal barrier is at least one of a titanium, or titanium-tungsten material.

6. A photodetector comprising:
a photodiode including:
a cap layer defining an inboard side and an outboard side;
a plurality of pixels formed in the cap layer extending from the inboard side to the outboard side of the cap layer to an absorption layer, wherein at least a portion of the cap layer is defined in between the pixels;
a metal barrier in between the pixels operatively connected to the inboard side of the cap layer in between the pixels to reflect photons into the cap layer reducing the leakage of photons between the pixels;
a passivation layer on the inboard side of the cap layer, between the metal barrier and the cap layer, wherein the metal barrier is disposed on an inboard side of the passivation layer; and
a plurality of metal overlays, wherein each metal overlay extends through the passivation layer to the inboard side of the cap layer to operatively connect to a respective one of the pixels.

7. The photodetector as recited in claim 6, further comprising the absorption layer operatively connected to the outboard side of the cap layer, wherein at least one of the pixels extends through the cap layer into the absorption layer to receive photons therefrom.

8. The photodetector as recited in claim 7, wherein the absorption layer is an InGaAs absorption layer.

9. The photodetector as recited in claim 7, further comprising a substrate operatively connected to an outboard side of the absorption layer and an anti-reflective coating operatively connected to an outboard side of the substrate.

10. The photodetector as recited in claim 6, wherein the metal barrier is at least one of a titanium, or titanium-tungsten material.

11. The photodetector as recited in claim 6, further comprising a read-out integrated circuit (ROIC) operatively connected to the photodiode, wherein the metal barrier is deposited between the ROIC and the cap layer.

\* \* \* \* \*